(12) United States Patent
Lasser

(10) Patent No.: US 7,583,545 B2
(45) Date of Patent: Sep. 1, 2009

(54) METHOD OF STORING DATA IN A MULTI-BIT-CELL FLASH MEMORY

(75) Inventor: Menahem Lasser, Kohav Yair (IL)

(73) Assignee: Sandisk IL Ltd, Kfar Saba (IL)

( * ) Notice: Subject to any disclaimer, the term of this patent is extended or adjusted under 35 U.S.C. 154(b) by 306 days.

(21) Appl. No.: 11/723,571

(22) Filed: Mar. 21, 2007

(65) Prior Publication Data

US 2007/0268745 A1 Nov. 22, 2007

Related U.S. Application Data

(60) Provisional application No. 60/747,801, filed on May 21, 2006.

(51) Int. Cl.
*G11C 7/00* (2006.01)
(52) U.S. Cl. ............... 365/189.16; 365/185.03; 365/185.11
(58) Field of Classification Search ............ 365/189.16, 365/185.03, 185.11
See application file for complete search history.

(56) References Cited

U.S. PATENT DOCUMENTS

| | | | |
|---|---|---|---|
| 5,404,485 A | 4/1995 | Ban | |
| 5,434,825 A | 7/1995 | Harari | |
| 5,930,167 A | 7/1999 | Lee et al. | |
| 5,937,425 A | 8/1999 | Ban | |
| 6,148,354 A | 11/2000 | Ban et al. | |
| 6,426,893 B1 | 7/2002 | Conley et al. | |
| 6,456,528 B1 | 9/2002 | Chen | |
| 6,522,580 B2 | 2/2003 | Chen et al. | |
| 7,031,214 B2 * | 4/2006 | Tran .................. | 365/185.11 |
| 7,149,110 B2 * | 12/2006 | Tran et al. .............. | 365/185.03 |
| 7,376,009 B2 * | 5/2008 | Shibata et al. ......... | 365/185.03 |
| 2004/0042269 A1 | 3/2004 | Tamura et al. | |
| 2007/0253250 A1 * | 11/2007 | Shibata et al. ......... | 365/185.03 |

FOREIGN PATENT DOCUMENTS

WO WO2005/076745 8/2005

OTHER PUBLICATIONS

A Multipage Cell Architecture for High-Speed Programming Multilevel NAND Flash Memories, Ken Takeuchi, Tomoharu Tanaka, and Toru Tanzawa, *Ieee Journal of Solid State Circuits* vol. 33. No. 8, Aug. 1998 pp. 1228-1238.
ISSCC 2004 Session 2 Non—Vilotile Memory 2.7, Seungjae Lee, Young-Taek Lee, Wook-Kee Han, Dong-Hwan Kim, Moo-Sung Kim, Young Ho Lim, Hyung-Suk Kim, Sung-Hoi Hur, Kang-Deog Suh,2004.

* cited by examiner

*Primary Examiner*—Tuan T. Nguyen
(74) *Attorney, Agent, or Firm*—Davis Wright Tremaine LLP

(57) ABSTRACT

In writing to a block, of a flash memory, that includes pages with different write access or read access speeds, after writing first data to a first page that has fast access, at least one page that has slow access is skipped to write second data to a second page that has fast access.

18 Claims, 3 Drawing Sheets

METHOD OF STORING DATA IN A MULTI-BIT-CELL FLASH MEMORY

This patent application claims the benefit of U.S. Provisional Patent Application No. 60/747,801, filed May 21, 2006

FIELD AND BACKGROUND OF THE INVENTION

The present invention relates to flash memories and, more particularly, to a method of managing a flash memory whose cells can be programmed with more than one bit each.

Flash memory devices have been known for many years. Typically, each cell within a flash memory stores one bit of information. Traditionally, the way to store a bit has been by supporting two states of the cell—one state represents a logical "0" and the other state represents a logical "1". In a flash memory cell the two states are implemented by having a floating gate above the cell's channel (the area connecting the source and drain elements of the cell's transistor), and having two valid states for the amount of charge stored within this floating gate. Typically, one state is with zero charge in the floating gate and is the initial unwritten state of the cell after being erased (commonly defined to represent the "1" state) and another state is with some amount of negative charge in the floating gate (commonly defined to represent the "0" state). Having negative charge in the gate causes the threshold voltage of the cell's transistor (i.e. the voltage that has to be applied to the transistor's control gate in order to cause the transistor to conduct) to increase. Now it is possible to read the stored bit by checking the threshold voltage of the cell—if the threshold voltage is in the higher state then the bit value is "0" and if the threshold voltage is in the lower state then the bit value is "1". Actually there is no reed to accurately read the cell's threshold voltage—all that is needed is to correctly identify in which of the two states the cell is currently located. For that purpose it suffices to make a comparison against a reference voltage value that is in the middle between the two states, and thus to determine if the cell's threshold voltage is below or above this reference value.

FIG. 1A shows graphically how this works. Specifically, FIG. 1A shows the distribution of the threshold voltages of a large population of cells. Because the cells in a flash device are not exactly identical in their characteristics and behavior (due, for example, to small variations in impurity concentrations or to defects in the silicon structure), applying the same programming operation to all the cells does not cause all of the cells to have exactly the same threshold voltage. (Note that, for historical reasons, writing data to a flash memory is commonly referred to as "programming" the flash memory. The terms "writing" and "programming" are used interchangeably herein.) Instead, the threshold voltage is distributed similar to the way shown in FIG. 1A. Cells storing a value of "1" typically have a negative threshold voltage, such that most of the cells have a threshold voltage close to the value shown by the left peak of FIG. 1A, with some smaller numbers of cells having lower or higher threshold voltages. Similarly, cells storing a value of "0" typically have a positive threshold voltage, such that most of the cells have a threshold voltage close to the value shown by the right peak of FIG. 1A, with some smaller numbers of cells having lower or higher threshold voltages.

In recent years a new kind of flash device has appeared on the market, using a technique conventionally called "Multi Level Cells" or MLC for short. (This nomenclature is misleading, because the previous type of flash cells also has more than one level: they have two levels, as described above. Therefore, the two kinds of flash cells are referred to herein as "Single Bit Cells" (SBC) and "Multi-Bit Cells" (MBC).) The improvement brought by the MBC flash is the storing of two bits in each cell. (In principle MBC also includes the storage of more than two bits per cell. In order to simplify the explanations, the two-bit case is emphasized herein. It should however be understood the present invention is equally applicable to flash memory devices that support more than two bits per cell.) In order for a single cell to store two bits of information the cell must be able to be in one of four different states. As the cell's "state" is represented by its threshold voltage, it is clear an MBC cell should support four different valid ranges for its threshold voltage. FIG. 1B shows the threshold voltage distribution for a typical MBC cell. As expected, FIG. 1B has four peaks, each corresponding to one of the states. As for the SBC case, each state is actually a range of threshold voltages and not a single threshold voltage. When reading the cell's contents, all that must be guaranteed is that the range that the cell's threshold voltage is in is correctly identified. For a prior art example of an MBC flash device see U.S. Pat. No. 5,434,825 to Harari.

When encoding two bits in an MBC cell as one of the four states, it is common to have the left-most state in FIG. 1B (typically having a negative threshold voltage) represent the case of both bits having a value of "1". (In the discussion below the following notation is used—the two bits of a cell are called the "lower bit" and the "upper bit". An explicit value of the bits is written in the form ["upper bit" "lower bit"], with the lower bit value on the right. So the case of the lower bit being "0" and the upper bit being "1" is written as "10". One must understand that the selection of this terminology and notation is arbitrary, and other names and encodings are possible). Using this notation, the left-most state represents the case of "11". The other three states are illustrated as assigned in the following order from left to right— "10", "00", "01". One can see an example of an implementation of an MBC NAND flash device using such encoding as described above in U.S. Pat. No. 6,522,580 to Chen, which patent is incorporated by reference for all purposes as if fully set forth herein. See in particular FIG. 8 of the Chen patent. It should be noted though that the present invention does not depend on this assignment of the states, and there are other ordering that can be used. When reading an MBC cell's content, the range that the cell's threshold voltage is in must be identified correctly; only in this case this cannot always be achieved by comparing to one reference voltage, and several comparisons may be necessary. For example, in the case illustrated in FIG. 1B, one way to read the lower bit is first to compare the cell's threshold voltage to a reference comparison voltage $V_1$ and then, depending on the outcome of the comparison, to compare the cell's threshold voltage to either a zero reference comparison voltage or a reference comparison voltage $V_2$. Another way to read the lower bit is to compare the cell's threshold voltage unconditionally to both the zero reference voltage and $V_2$. In either case, two comparisons are needed.

MBC devices provide a great advantage of cost—using a similarly sized cell one stores two bits rather than one. However, there are also some drawbacks to using MBC flash—the average read and write times of MBC memories are longer than of SLC memories, resulting in lower performance. Also, the reliability of MBC is lower than SBC. This can easily be understood—the differences between the threshold voltage ranges in MBC are much smaller than in SBC. Thus, a disturbance in the threshold voltage (e.g. leaking of the stored charge causing a threshold voltage drift, interference from operations on neighboring cells, etc.) that may have gone unnoticed in SBC because of the large gap between the two states, might cause an MBC cell to move from one state to another, resulting in an erroneous bit. The end result is a lower quality specification of MBC cells in terms of data retention time or the endurance of the device to many write/erase cycles. Thus there are advantages to using both MBC cells and SBC cells, and the selection can be different depending on the application's requirements.

The most common type of data storage flash memory is the NAND type, so called because of the architecture by which its cells are internally connected. In NAND flash writing operations may only be done for relatively large chunks of data (typically 512 bytes to 2 Kilobytes), and not for single bytes or small groups of bytes. The smallest data chunk that can be independently written in such devices is called a "page". Reading operations are also done in units of pages, in the sense that a full page is always retrieved from the array of cells into a RAM buffer in the flash device. In many MBC NAND flash devices the two or more bits that share a memory cell are assigned to different respective pages. For example, in a two-bit-cell MBC device, the lower bit of a cell may belong to page number zero, while the upper bit of the cell belongs to page number one (or, more generally, the lower bit of a cell may belong to page number 2n while the upper bit of the cell belongs to page 2n+1).

One side-effect detected in MBC NAND flash devices with cells shared across multiple pages as described above is that, unlike in SBC flash devices, the programming time of a page of memory varies between different pages and is not the same for all pages. This can be understood by referring to FIG. 1B showing one example of the encoding of the bits in a two-bit MBC cell. When writing the lower bit into a cell, we either do nothing (when the written bit is "1") or we shift the state from "11" to "10" (when the written bit is "0"). Then when writing the upper bit into the cell, we either do nothing (if the written bit is "1") or we shift the state from "10" to "00" (if both lower and upper bits are "0") or we shift the state from "11" to "01" (if the lower bit was "1" and the upper bit is "0"). The shift of threshold voltage when writing the upper (second) bit may be much larger than the shift when writing the lower (first) bit. In the former case we may need to shift the cell from the left-most state to the right-most state (that is—from "11" to "01"), while in the latter case the most we do is to shift the cell one "position" (from "11" to "10"). Shifting the state (that is—the cell's threshold voltage) over larger distances requires more programming pulses and therefore more time. Therefore it is indeed to be expected that in devices implemented according to the above example programming page zero (which uses lower bits) will be faster than programming page one (which uses upper bits).

A similar effect occurs for reading. In the above example, reading an upper bit from a cell can be done by one comparison only—distinguishing between the two leftmost states ("11" and "10") and the two right-most states ("00" and "01"), while reading a lower bit requires two comparisons. Therefore it should be expected that in devices implemented according to the above example, reading of page zero (which uses lower bits) will be slower than reading page one (which uses upper bits).

Data sheets of MBC NAND devices do not usually disclose this fact of dependency of write and read operations time on page number. One may look as an example at the data sheet of the TC58NVG2D4BFT00 MBC 4 Gbit NAND flash device of Toshiba Corporation. The data sheet only specifies "average" or "typical" values for programming time and reading time. But when one runs actual tests on this device one can easily detect the dependency exactly as predicted in the above example—even-numbered pages are faster to write and slower to read, and odd-numbered pages are slower to write and faster to read. Indeed in this Toshiba device the write time of even-numbered pages and the read time of odd-numbered pages are close to the corresponding times in corresponding SBC devices of the same process generation. This is not true in all devices, but it is quite a typical case.

One should understand that this specific behavior pattern is not necessarily the case for all devices—other devices might use different bit encoding schemes for their cells' states and their page-dependency pattern might be different. For example there may be flash devices where the even-numbered pages are slower to write and faster to read, and odd-numbered pages are faster to write and slower to read. There may be flash devices in which the first two out of each aligned group of four pages have a performance pattern different from the performance pattern of the last two pages of that group. There may be flash devices in which the rule to find out whether a given page has a certain read or write performance characteristic is quite complex, but as long as the MBC NAND device architecture is such that cells are shared across multiple pages, it always is the case that not all pages have the same write time and read time.

It is obvious that a cell designed for MBC operation should also be able to operate as an SBC cell. After all, two states are just a subset of four states. Indeed, this idea already has appeared in the prior art—see for example U.S. Pat. No. 6,426,893, to Conley et al., that is incorporated by reference for all purposes as if fully set forth herein, wherein it is proposed to use both MBC and SBC modes within the same device, selecting certain parts of the device to operate with highest density in MBC mode, while other parts are used in SBC mode and provide better performance.

Other prior art goes even further—deciding on the mode a specific flash block operates in (whether MBC or SBC) dynamically during an application's run-time. For example, U.S. Pat. No. 5,930,167 to Lee et al., that also is incorporated by reference for all purposes as if fully set forth herein, describes a system in which incoming data According to the present invention there is provided a method of using a flash memory that includes at least one block, each block including a first plurality of pages and a second plurality of pages, the first plurality of pages having faster write access than the second plurality of pages, the method including the steps of: (a) writing first data to a first page of the first plurality of pages of one of the at least one block; and (b) skipping at least one page of the second plurality of pages of the one block to write second data to a second page of the first plurality of pages of the one block.

According to the present invention there is provided a memory device, for storing data, including: (a) a flash memory that includes at least one block, each block including a first plurality of pages and a second plurality of pages, the first plurality of pages having faster write access than the second plurality of pages; and (b) a controller operative: (i) to write first data to a first page of the first plurality of pages of one of the at least one block, and (ii) to skip at least one page of the second plurality of pages of the one block to write second data to a second page of the first plurality of pages of the one block.

According to the present invention there is provided a system, for storing data, including: (a) a memory device that includes a flash memory that includes at least one block, each block including a first plurality of pages and a second plurality of pages, the first plurality of pages having faster write access than the second plurality of pages; and (b) a processor operative: (i) to write first data to a first page of the first plurality of pages of one of the at least one block, and (ii) to skip at least one page of the second plurality of pages of the one block to write second data to a second page of the first plurality of pages of the one block.

According to the present invention there is provided a computer readable storage medium having computer readable code embodied on the computer readable storage medium, the computer readable code for managing a flash memory that includes at least one block, each block including a first plurality of pages and a second plurality of pages, the first plurality of pages having faster write access than the second plurality of pages, the computer readable code including: (a) program code for writing first data to a first page of the first plurality of pages of one of the at least one block; and (b) program code for skipping at least one page of the second plurality of pages of the one block to write second data to a second page of the first plurality of pages of the one block.

According to the present invention there is provided a method of using a flash memory that includes a plurality of blocks, each block including a first plurality of pages and a second plurality of pages, the first plurality of pages having faster write access than the second plurality of pages, the method including the steps of: (a) writing first data to a first page of the first plurality of pages of a first block; (b) skipping at least one page of the second plurality of pages of the first block to write second data to a second page of the first plurality of pages of the first block; and (c) copying the first and second data to at least one page of the first plurality of pages of a second block other than the first block and to at least one page of the second plurality of pages of the second block.

According to the present invention there is provided a method of using a flash memory that includes at least one block, each block including a first plurality of pages and a second plurality of pages, the first plurality of pages having faster read access than the second plurality of pages, the method including the steps of: (a) writing first data to a first page of the first plurality of pages of one of the at least one block; and (b) skipping at least one page of the second plurality of pages of the one block to write second data to a second page of the first plurality of pages of the one block.

According to the present invention there is provided a memory device, for storing data, including: (a) a flash memory that includes at least one block, each block including a first plurality of pages and a second plurality of pages, the first plurality of pages having faster read access than the second plurality of pages; and (b) a controller operative: (i) to write first data to a first page of the first plurality of pages of one of the at least one block, and (ii) to skip at least one page of the second plurality of pages of the one block to write second data to a second page of the first plurality of pages of the one block.

According to the present invention there is provided a system, for storing data, including: (a) a memory device that includes a flash memory that includes at least one block, each block including a first plurality of pages and a second plurality of pages, the first plurality of pages having faster read access than the second plurality of pages; and (b) a processor operative: (i) to write first data to a first page of the first plurality of pages of one of the at least one block, and (ii) to skip at least one page of the second plurality of pages of the one block to write second data to a second page of the first plurality of pages of the one block.

According to the present invention there is provided a method of using a flash memory that includes a plurality of blocks, each block including a first plurality of pages and a second plurality of pages, the first plurality of pages having faster read access than the second plurality of pages, the method including the steps of: (a) writing first data to a first page of the first plurality of pages of a first block; (b) skipping at least one page of the second plurality of pages of the first block to write second data to a second page of the first plurality of pages of the first block; and (c) writing third data to both at least one page of the first plurality of pages of a second block other than the first block and to at least one page of the second plurality of pages of the second block.

According to the present invention there is provided a computer readable storage medium having computer readable code embodied on the computer readable storage medium, the computer readable code for managing a flash memory that includes at least one block, each block including a first plurality of pages and a second plurality of pages, the first plurality of pages having faster read access than the second plurality of pages, the computer readable code including: (a) program code for writing first data to a first page of the first plurality of pages of one of the at least one block; and (b) program code for skipping at least one page of the second plurality of pages of the one block to write second data to a second page of the first plurality of pages of the one block.

The present invention is directed towards methods and systems for writing data to a flash memory and towards computer-readable storage media that bear code for implementing the methods. Specifically, the present invention is directed towards flash memories whose blocks include two kinds of pages: pages with relatively fast write access or read access speeds and pages with relatively slow write access or read access speeds. Generally, an application running on a host of the memory writes more than one page's worth of data to a block of the memory. The general concept of the present invention is, after writing data to a fast access page, to skip one or more slow access pages and to continue writing data to another fast access page.

In the appended claims, the fast-access page that is written to before skipping the slow access pages is called the "first" fast-access page, the data written to that page are called "first" data, the fast-access page that is written to after skipping the slow-access pages is called the "second" fast-access page, and the data written to that page are called "second" data. The terms "first page" and "second page", as used in the appended claims, therefore do not imply that the "first page" is the first page of the block and that the "second page" is the second page of the block, or even that the "second page" is the second fast-access page of the block. For example, in some flash memories, the fast-access pages and the slow-access pages alternate within the blocks: if the pages of a block are numbered starting from zero, the even-numbered pages are fast-access pages and the odd-numbered pages are slow-access pages. Then if writing starts from page 0, page 1 is skipped and writing resumes at page 2, so that page 0 is the "first page" and page 2 is the "second page". In other flash memories, pairs of fast-access pages and slow-access pages alternate within the blocks: if the pages of a block are numbered starting from zero, the pages numbered 4n and 4n+1 are fast-access pages and the pages numbered 4n+2 and 4n+3 are slow-access pages. Then if writing starts from page 0, pages 2 and 3 are skipped and writing resumes from page 4. Either page 0 or page 1 can be considered the "first page", and page 4 is the "second page".

BRIEF DESCRIPTION OF THE DRAWINGS

The invention is herein described, by way of example only, with reference to the accompanying drawings, wherein.

DESCRIPTION OF THE PREFERRED EMBODIMENTS

Figure 1A:
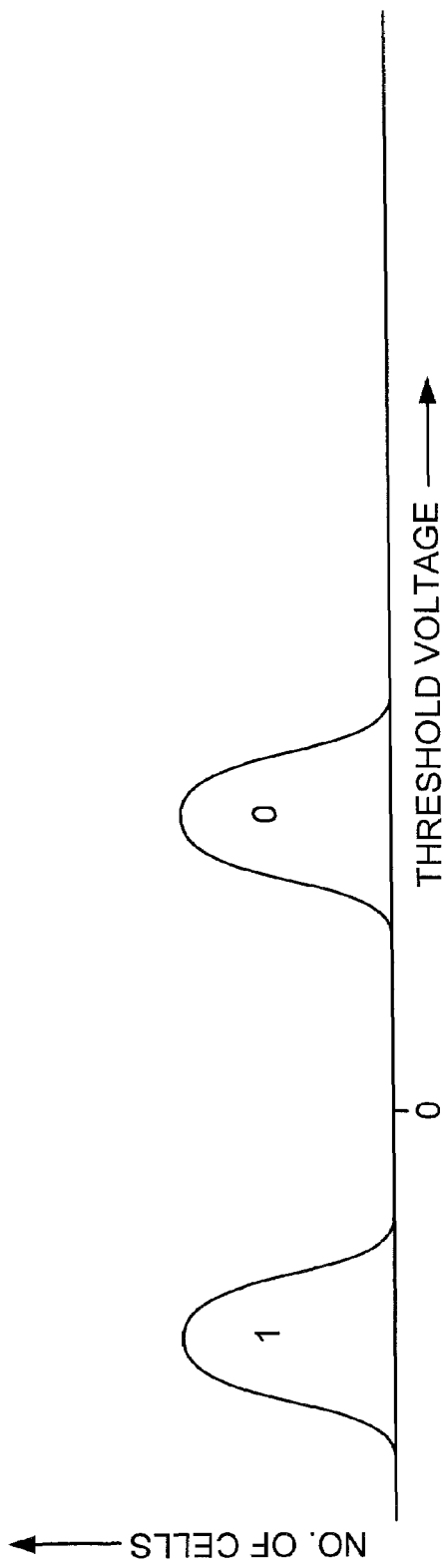
FIG. 1A illustrates the threshold voltage distributions of flash cells programmed in 1-bit mode.

The principles and operation of a flash memory such as a NAND flash memory according to the present invention may be better understood with reference to the drawings and the accompanying description.

The present invention provides a user of an exclusively MBC NAND flash memory device with advantages similar to those provided by a MBC NAND flash memory device that supports SBC mode. This is achieved by utilizing the page number dependency of the time of operations and using only the fastest pages for certain uses.

For the sake of simplicity let us continue to use the MBC NAND device example of the Field and Background section. In this example, even-numbered pages are faster to write and slower to read, and odd-numbered pages are slower to write and faster to read.

Suppose one desires to implement the self-caching methods of Lee et al. using the Toshiba device mentioned above. In other words one desires to write incoming data into a relatively fast memory, and later when more time is available, to copy this data to a slower final destination location. One then allocates a few memory blocks as a cache (where a block is a unit of storage larger than a page and typically containing many pages) that is to absorb the incoming data as it arrives, exactly as Lee et al. do with SBC mode. But instead of using the allocated blocks in SBC mode (which is impossible in the Toshiba device), the cache-allocated blocks are used in a mode we may call "SBC write emulation mode"—only pages that are fast to write are used, while all the other pages are skipped. So in our example if a block contains 64 pages, the cached data is written into pages 0,2,4,6, . . . , 62 of each block, while pages 1,3,5,7, . . . ,63 remain empty and are not written. As the writing time of the even-numbered pages is similar to the writing time of SBC pages, the resulting effect is the same as using the method and device of Lee et al.

We may note that while the above method wastes half of the storage space of the caching blocks, this is no different from the SBC method of Lee et al. because using a two-bit MBC block in SBC mode also wastes half of its storage capacity.

A similar method may be employed in the case that the desired characteristics is fast reading rather than fast writing. For example if one desires to implement a file system where reading is much more frequent than writing and to improve the system's performance by having a fast area for the File Allocation Table (FAT) of the file system, as proposed in Conley et al., one can allocate MBC blocks for storing the FAT and use only the odd-numbered pages for actually storing FAT data, skipping the even-numbered ones. As the reading time of the odd-numbered pages is typically similar to the reading time of SBC pages, the resulting effect of read performance improvement is the same as when using SBC mode for storing the FAT.

It should be emphasized again that the dividing rule between faster and slower pages does not necessarily have to be even numbers vs. odd numbers. Depending on the implementation of the MBC NAND device, the rule may be different. In each specific case one needs to find out which pages are faster (either for writing or for reading, depending on which of the two operations is more important for the current case), and then use only those faster pages in the blocks of memory whose operation has to be sped up.

Implicit in this description of the present invention is the notion that when data are written to a block of a MBC NAND flash memory, the pages are written in a pre-defined sequential order. During normal (prior art) writing of data to a block of the memory, the pages are written according to that pre-defined order: first the first page s in the ordered sequence, then the second page in the ordered sequence, then the third page in the ordered sequence, etc. In the exemplary MBC NAND flash device described above, fast page 0 is written, then fast page 2 is written (skipping slow page 1), then fast page 4 is written (skipping slow page 3), etc. In the context of the present invention, "skipping" a slow page means refraining from writing to a slow page and instead writing to the next page of the ordered sequence that is a fast page. So in the example above of emulating the method of Lee et al., fast page 0 is accessed and written, then slow page 1 is skipped and fast page 2 is accessed and written, then slow page 3 is skipped and fast page 4 is accessed and written, etc.

The scope of the present invention includes the flash memory management method described above. The scope of the present invention also includes a memory system comprising a flash memory and a controller for the memory employing this flash memory management method. The scope of the present invention also includes a computing system comprising a memory system employing this flash memory management method. The scope of the present invention also includes a computing system comprising a memory and a host computer employing this flash memory management method, where no dedicated memory controller is used. The scope of the present invention also includes a computer-readable storage medium bearing code for implementing this flash memory management method.

Figure 1B:
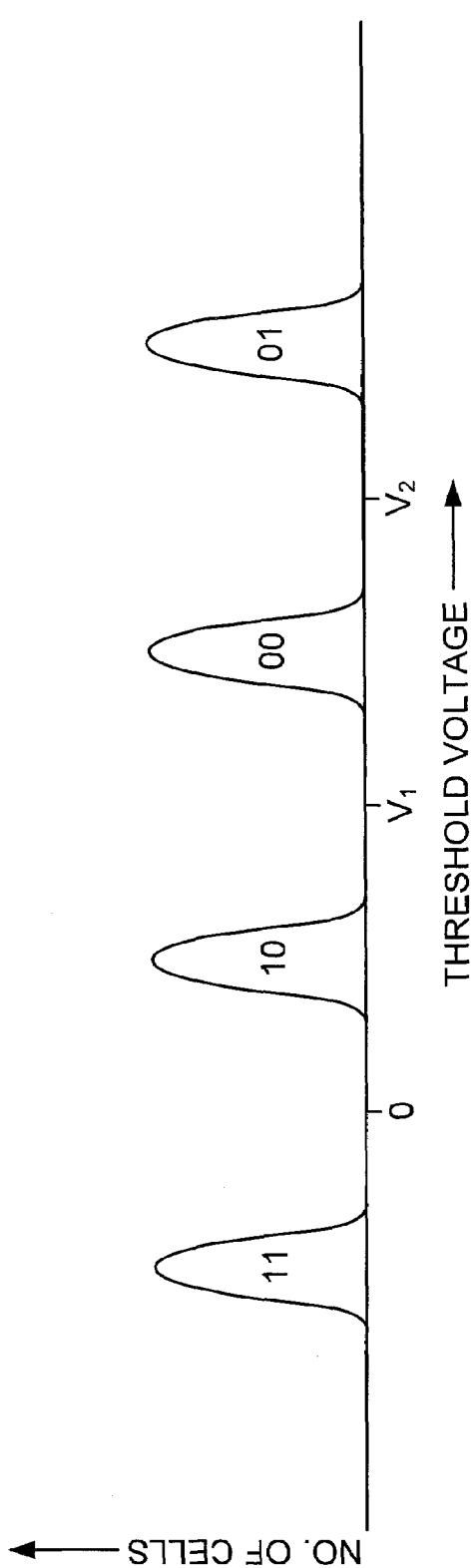
FIG. 1B illustrates the threshold voltage distributions of flash cells programmed in 2-bit mode.
Figure 2:
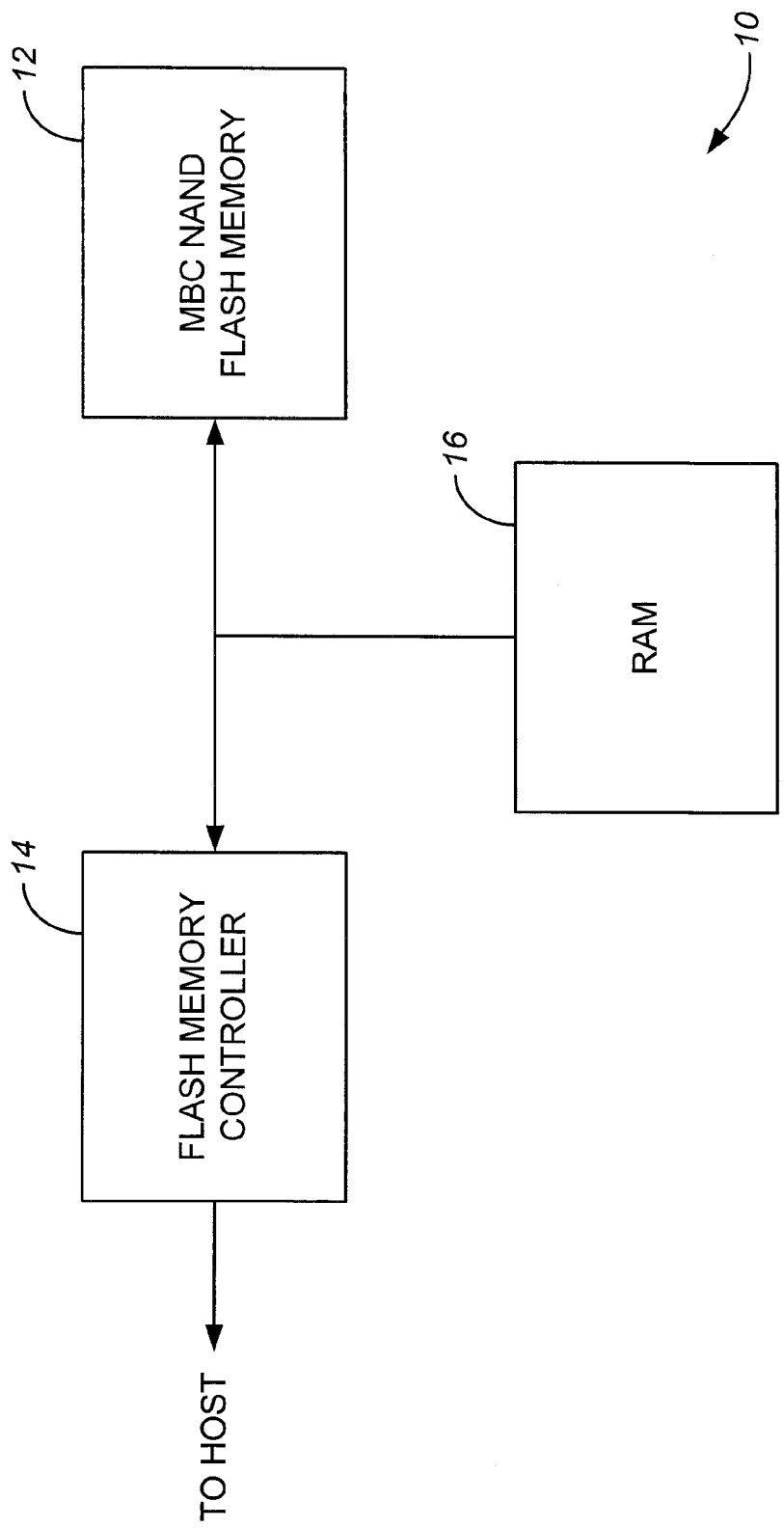
FIG. 2 is a high-level block diagram of a flash memory device of the present invention.

Referring again to the drawings, FIG. 2 is a high-level block diagram of a flash memory device 10 of the present invention. FIG. 2 is adapted from FIG. 1 of U.S. Pat. No. 5,404,485, to Ban, which patent is incorporated by reference for all purposes as if fully set forth herein. Device 10 includes an MBC NAND flash memory 12, a flash memory controller 14 and a RAM 16. Controller 14 manages memory 12 as taught in U.S. Pat. No. 5,404,485, and in U.S. Pat. No. 5,937, 425, also to Ban, which patent also is incorporated by reference for all purposes as if fully set forth herein. (U.S. Pat. No. 5,404,485 applies to the management of flash memories generally. U.S. Pat. No. 5,937,425 is specific to NAND flash memories.) The MBC aspect of device 10 is implemented as described in the Harari patent cited in the Field and Background section. Controller 14 exchanges data stored in memory 12 with a host device (not shown) in the conventional manner. For example, if device 10 is used for non-volatile data storage in a system such as a personal computer, then controller 14 communicates with the other components of the system via the system's bus. If device 10 is a portable storage device that is reversibly attached to a host using a suitable interface, for example the USB interface taught in U.S. Pat. No. 6,148,354, to Ban et al., then controller 14 communicates with the host via that interface.

Controller 10 writes data receives from the host to memory 12 in the manner of the present invention. Usually, in writing to a block of memory 12, controller 10 writes sequentially to the pages of the block. Optionally, in writing to a block of memory 12, controller 10 skips some of the pages of the block as described above. For example, in emulating the method of Lee et al., controller 10 writes only to pages that have fast write access and skips pages that have slow write access when data are initially written to memory 12; and in emulating the method of Conley et al., controller 10 writes only to pages that have fast read access and skips pages that have slow read access when writing the FAT to memory 12.

Figure 3:
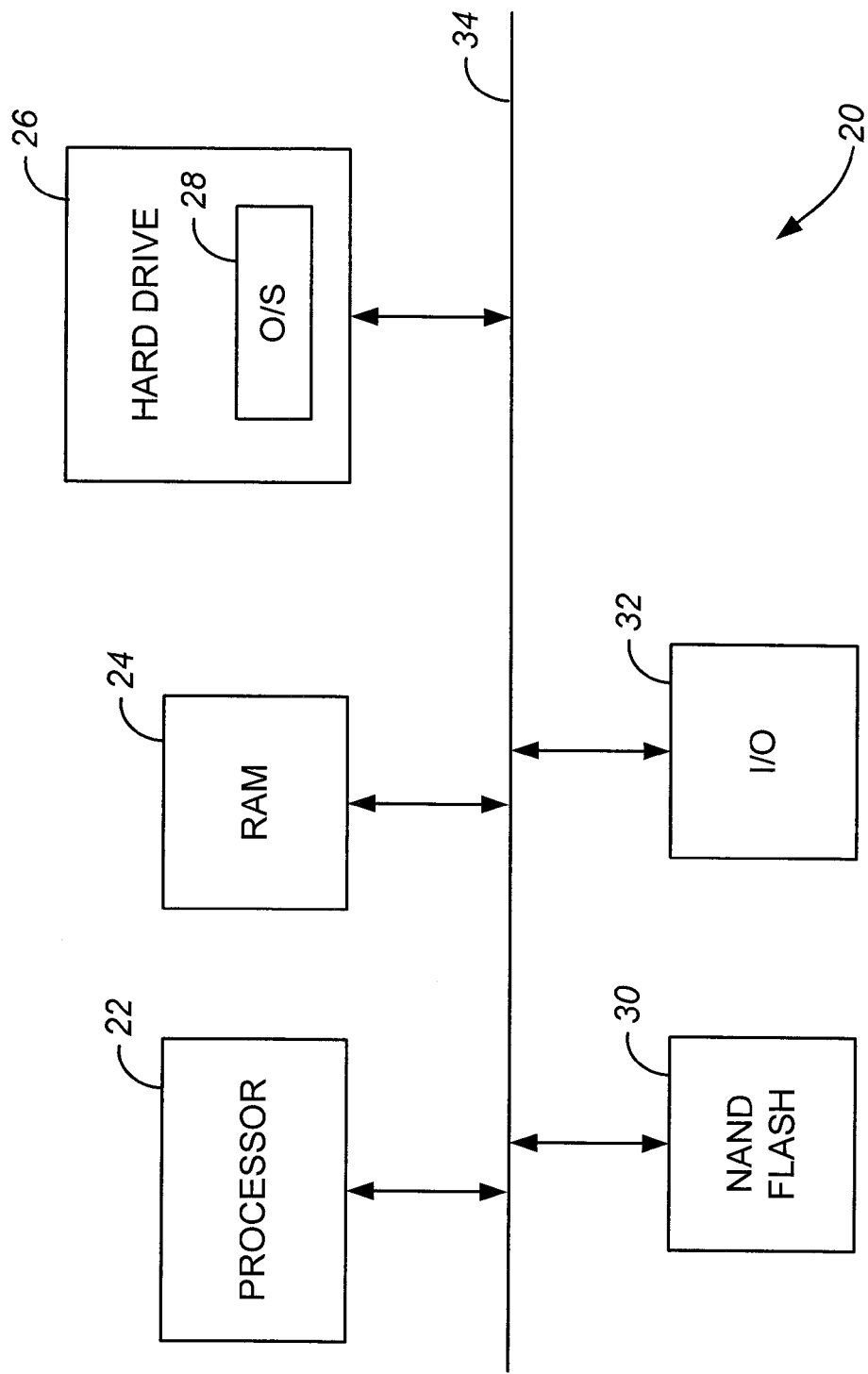
FIG. 3 is a high-level block diagram of a computer system of the present invention.

Device 10 is an example of a firmware implementation of the method of the present invention. FIG. 3 is a partial high level block diagram of a computer system 20 of the present invention that is an example of a software implementation of the method of the present invention. System 20 includes a processor 22; a RAM 24; input and output devices such as a keyboard and a display screen, represented collectively by I/O block 32; and two non-volatile mass storage memories: a hard disk 26 and an MBC NAND flash memory 30. Components 22, 24, 26, 30 and 32 communicate with each other via a common bus 34. Among the data stored on hard disk 26 is the code of an operating system 28. When system 20 is powered up, processor 22 downloads the code of operating system 28 to RAM 24 and then executes the code of operating system 28 from RAM 24 to manage the operation of system 20. Hard disk 26 thus is an example of a computer-readable storage medium in which is embedded computer-readable code for implementing the method of the present invention.

The code of operating system 28 includes code for managing NAND flash memory 30 as taught in the two Ban patents and in the Harari patent cited above. The code of operating system 28 also includes code for writing data to NAND flash memory 30 according to the principles of the present invention. For example, in emulating the method of Lee et al., the first time processor 22 writes certain data to NAND flash memory 30, processor 22 executes the appropriate code of operating system 28 to write only to pages that have fast write access while skipping pages that have slow write access; and in emulating the method of Conley et al., processor 22 executes the appropriate code of operating system 28 to write the FAT only to pages that have fast read access while skipping the pages that have slow read access.

While the invention has been described with respect to a limited number of embodiments, it will be appreciated that many variations, modifications and other applications of the invention may be made.

What is claimed is:

1. A method of using a flash memory that includes at least one block, each block including a first plurality of pages and a second plurality of pages, the first plurality of pages having faster write access than the second plurality of pages, the method comprising the steps of:
   (a) writing first data to a first page of the first plurality of pages of one of the at least one block; and
   (b) skipping at least one page of the second plurality of pages of said one block to write second data to a second page of the first plurality of pages of said one block.

2. A memory device, for storing data, comprising:
   (a) a flash memory that includes at least one block, each said block including a first plurality of pages and a second plurality of pages, said first plurality of pages having faster write access than the second plurality of pages; and
   (b) a controller operative:
      (i) to write first data to a first page of said first plurality of pages of one of said at least one block; and
      (ii) to skip at least one page of said second plurality of pages of said one block to write second data to a second page of said first plurality of pages of said one block.

3. The device of claim 2, wherein said pages of said first and second pluralities alternate within each said block.

4. The device of claim 2, wherein pairs of said pages of said first plurality alternate with pairs of pages of said second plurality within each said block.

5. A system, for storing data, comprising:
   (a) a memory device that includes a flash memory that includes at least one block, each said block including a first plurality of pages and a second plurality of pages, said first plurality of pages having faster write access than said second plurality of pages; and
   (b) a processor operative:
      (i) to write first data to a first page of said first plurality of pages of one of said at least one block; and
      (ii) to skip at least one page of said second plurality of pages of said one block to write second data to a second page of said first plurality of pages of said one block.

6. The device of claim 5, wherein said pages of said first and second pluralities alternate within each said block.

7. The device of claim 5, wherein pairs of said pages of said first plurality alternate with pairs of pages of said second plurality within each said block.

8. A computer readable storage medium having computer readable code embodied on said computer readable storage medium, the computer readable code for managing a flash memory that includes at least one block, each block including a first plurality of pages and a second plurality of pages, the first plurality of pages having faster write access than the second plurality of pages, the computer readable code comprising:
   (a) program code for writing first data to a first page of the first plurality of pages of one of the at least one block; and
   (b) program code for skipping at least one page of the second plurality of pages of said one block to write second data to a second page of the first plurality of pages of said one block.

9. A method of using a flash memory that includes a plurality of blocks, each block including a first plurality of pages and a second plurality of pages, the first plurality of pages having faster write access than the second plurality of pages, the method comprising the steps of:
   (a) writing first data to a first page of the first plurality of pages of a first block;
   (b) skipping at least one page of the second plurality of pages of said first block to write second data to a second page of the first plurality of pages of said first block; and
   (c) copying said first and second data to at least one page of the first plurality of pages of a second block other than said first block and to at least one page of the second plurality of pages of said second block.

10. A method of using a flash memory that includes at least one block, each block including a first plurality of pages and a second plurality of pages, the first plurality of pages having faster read access than the second plurality of pages, the method comprising the steps of:
    (a) writing first data to a first page of the first plurality of pages of one of the at least one block; and
    (b) skipping at least one page of the second plurality of pages of said one block to write second data to a second page of the first plurality of pages of said one block.

11. A memory device, for storing data, comprising:
    (a) a flash memory that includes at least one block, each said block including a first plurality of pages and a second plurality of pages, said first plurality of pages having faster read access than the second plurality of pages; and (b) a controller operative:
  (i) to write first data to a first page of said first plurality of pages of one of said at least one block; and
  (ii) to skip at least one page of said second plurality of pages of said one block to write second data to a second page of said first plurality of pages of said one block.

12. The device of claim 11, wherein said pages of said first and second pluralities alternate within each said block.

13. The device of claim 11, wherein pairs of said pages of said first plurality alternate with pairs of pages of said second plurality within each said block.

14. A system, for storing data, comprising:
  (a) a memory device that includes a flash memory that includes at least one block, each said block including a first plurality of pages and a second plurality of pages, said first plurality of pages having faster read access than said second plurality of pages; and
  (b) a processor operative:
    (i) to write first data to a first page of said first plurality of pages of one of said at least one block; and
    (ii) to skip at least one page of said second plurality of pages of said one block to write second data to a second page of said first plurality of pages of said one block.

15. The device of claim 14, wherein said pages of said first and second pluralities alternate within each said block.

16. The device of claim 14, wherein pairs of said pages of said first plurality alternate with pairs of pages of said second plurality within each said block.

17. A method of using a flash memory that includes a plurality of blocks, each block including a first plurality of pages and a second plurality of pages, the first plurality of pages having faster read access than the second plurality of pages, the method comprising the steps of:
  (a) writing first data to a first page of the first plurality of pages of a first block;
  (b) skipping at least one page of the second plurality of pages of said first block to write second data to a second page of the first plurality of pages of said first block; and
  (c) writing third data to both at least one page of the first plurality of pages of a second block other than said first block and to at least one page of the second plurality of pages of said second block.

18. A computer readable storage medium having computer readable code embodied on said computer readable storage medium, the computer readable code for managing a flash memory that includes at least one block, each block including a first plurality of pages and a second plurality of pages, the first plurality of pages having faster read access than the second plurality of pages, the computer readable code comprising:
  (a) program code for writing first data to a first page of the first plurality of pages of one of the at least one block; and
  (b) program code for skipping at least one page of the second plurality of pages of said one block to write second data to a second page of the first plurality of pages of said one block.

* * * * *